United States Patent
Ye et al.

(10) Patent No.: US 12,543,463 B2
(45) Date of Patent: Feb. 3, 2026

(54) UNDER-SCREEN CAMERA DISPLAY SCREEN AND DISPLAY DEVICE

(71) Applicant: HKC CORPORATION LIMITED, Shenzhen (CN)

(72) Inventors: Zhiwei Ye, Shenzhen (CN); Chen Chen, Shenzhen (CN); Xiufeng Zhou, Shenzhen (CN); Lidan Ye, Shenzhen (CN)

(73) Assignee: HK CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/754,227

(22) Filed: Jun. 26, 2024

(65) Prior Publication Data

US 2025/0056988 A1 Feb. 13, 2025

(30) Foreign Application Priority Data

Aug. 8, 2023 (CN) .......................... 202310992661.6

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/122* (2023.02);
(Continued)

(58) Field of Classification Search
CPC .... H10K 59/122; H10K 59/128; H10K 59/65; H10K 59/131; H10K 59/90; H10K 59/12; G09G 3/3233
See application file for complete search history.

(56) References Cited

U.S. PATENT DOCUMENTS 12,154,515 B2 * 11/2024 Ono ...................... G09G 3/3233
2010/0102713 A1 * 4/2010 Seo ...................... H10K 59/8723
313/504
2023/0055596 A1 2/2023 Zhang et al.

FOREIGN PATENT DOCUMENTS

CN 111192884 A 5/2020
CN 113299730 A * 8/2021 ......... H01L 27/3234
(Continued)

OTHER PUBLICATIONS

Chinese First Office Action, Chinese Application No. 202310992661.6, mailed Oct. 21, 2023 (17 pages).
(Continued)

*Primary Examiner* — Sardis F Azongha

(57) ABSTRACT

An under-screen camera display screen includes a display area and a non-display area. The display area includes an under-screen camera area. The non-display area that is located on a side of the display area and close to the under-screen camera area includes a bending area and a wiring area, and the wiring area is located on a side of the bending area away from the display area. After bending the bending area, the wiring area and at least a part of the bending area are attached to a non-display side of the under-screen camera display screen. A first pixel circuit that drives the light-emitting device corresponding to the under-screen camera area to emit light is disposed in the wiring area of the non-display area. A display device is also provided.

20 Claims, 5 Drawing Sheets

(51) Int. Cl.
*H10K 59/122* (2023.01)
*H10K 59/90* (2023.01)

(52) U.S. Cl.
CPC ..... *H10K 59/90* (2023.02); *G09G 2300/0426* (2013.01); *G09G 2300/0819* (2013.01); *G09G 2300/0842* (2013.01); *G09G 2300/0861* (2013.01)

(56) References Cited

FOREIGN PATENT DOCUMENTS

| | | |
|---|---|---|
| CN | 116156746 A | 5/2023 |
| CN | 116367596 A | 6/2023 |
| WO | 2021017821 A1 | 2/2021 |
| WO | 2023092686 A1 | 6/2023 |

OTHER PUBLICATIONS

Chinese Second Office Action, Chinese Application No. 202310992661.6, mailed Mar. 6, 2024 (14 pages).
Chinese Rejection decision, Application No. 202310992661.6, mailed May 10, 2024 (16 pages).

* cited by examiner

UNDER-SCREEN CAMERA DISPLAY SCREEN AND DISPLAY DEVICE

CROSS-REFERENCE TO RELATED APPLICATIONS

The present application claims priority to Chinese Patent Application No. 202310992661.6, entitled "UNDER-SCREEN CAMERA DISPLAY SCREEN AND DISPLAY DEVICE", filed Aug. 8, 2023, which is herein incorporated by reference in its entirety.

TECHNICAL FIELD

The present disclosure relates to the technical field of display, and in particular to an under-screen camera display screen and a display device.

BACKGROUND

With the rapid advancement of display technology, front-facing cameras have become a barrier to pursuing high screen to body ratios. In related art, in order to achieve front-facing photography, compromise designs such as reducing camera area resolution, digging grooves, opening holes, disposing lifting cameras or the like are adopted.

However, the design of digging grooves or opening holes affects aesthetics and cannot achieve ultra-high screen to body ratio. An additional mechanical structure is required to support the lifting camera, which poses a risk of damage.

SUMMARY OF THE DISCLOSURE

A first technical solution provided by the present disclosure is providing an under-screen camera display screen. The under-screen camera display screen includes a display area and a non-display area. The display area includes an under-screen camera area. The non-display area that is located on a side of the display area and close to the under-screen camera area includes a bending area and a wiring area, the wiring area is located on a side of the bending area away from the display area. After bending the bending area, the wiring area and at least a part of the bending area are attached to a non-display side of the under-screen camera display screen.

The under-screen camera display screen includes a pixel circuit.

The pixel circuit includes a first pixel circuit that is configured to drive a light-emitting device corresponding to the under-screen camera area to emit light.

The first pixel circuit is disposed in the wiring area.

In some embodiments, the wiring area includes a fanout area, a binding area, and a winding area. The bending area, the fanout area, and the binding area are arranged in a first direction, and the first direction is from the display area to the bending area. The winding area and the fanout area are arranged along a second direction, and the first direction intersects with the second direction. The first pixel circuit is located in a blank area between the fanout area and the winding area.

In some embodiments, the display area further includes a plurality of data lines, and the plurality of data lines extend along the first direction and are arranged along the second direction. The under-screen camera area is located in a junction area between both adjacent sides of the display area, and close to the blank area.

In some embodiments, the pixel circuit further includes a second pixel circuit, and the display area further includes a non-under-screen camera area. The second pixel circuit is configured to drive the light-emitting device corresponding to the non-under-screen camera area to emit light.

In some embodiments, the under-screen camera area includes a plurality of under-screen pixel areas and a plurality of light-transmitting areas. Each of the plurality of light-transmitting areas is between the plurality of under-screen pixel areas, and each of the plurality of under-screen pixel areas corresponds to one light-emitting device.

In some embodiments, the under-screen camera display screen includes a driving substrate. The driving substrate includes a base, a first metal layer, a second metal layer, and a third metal layer. The first metal layer, the second metal layer, and the third metal layer are sequentially formed on a side of the base.

The first metal layer is configured to form a light-shielding metal layer.

The second metal layer is configured to form a first gate electrode and a second gate electrode that are insulated from each other.

The third metal layer is configured to form a first source electrode, a second source electrode, a first drain electrode, and a second drain electrode that are insulated from each other.

The first gate electrode, the first drain electrode, and the first source electrode are configured to form a driving transistor of the first pixel circuit. The driving transistor is configured to control current of the light-emitting device. The second gate electrode, the second source electrode, and the second drain electrode are configured to form a switching transistor of the first pixel circuit. In the first pixel circuit, the switching transistor is connected between the light-emitting device and the driving transistor.

An anode of the light-emitting device is connected to the second drain electrode of the switching transistor through a via lead layer. The via lead layer at least partially overlaps with the first source electrode of the driving transistor in a direction perpendicular to the base, so as to form a storage capacitor.

In some embodiments, the driving transistor is a top gate structure. The light-shielding metal layer is connected to the first gate electrode of the driving transistor and the first source electrode of the driving transistor, respectively, so as to form a double gate transistor.

In some embodiments, the under-screen camera display screen further includes a light-emitting device layer, and the light-emitting device layer is disposed on a side of the driving substrate away from the base. The light-emitting device layer includes a pixel definition layer, the light-emitting device, and a spacer. The pixel definition layer defines an opening. The light-emitting device is disposed in the opening. The spacer is disposed on a side of the pixel definition layer away from the base and avoids the opening.

The spacer includes a conductive layer and an insulation barrier layer disposed on a side of the conductive layer away from the base. A cathode of the light-emitting device is connected to the conductive layer.

In some embodiments, the light-emitting device is an organic light-emitting diode.

A second technical solution provided by the present disclosure is providing a display device. The display device includes a camera module and the under-screen camera display screen of any one of above embodiments.

The under-screen camera display screen includes a display side and a non-display side that are opposite to each other. The camera module is disposed on the non-display side of the under-screen camera display screen and corresponds to the under-screen camera area.

BRIEF DESCRIPTION OF THE DRAWINGS

In order to more clearly illustrate the technical solutions in some embodiments of the present disclosure, hereinafter, a brief introduction will be given to the accompanying drawings that are used in the description of some embodiments. Obviously, the accompanying drawings in the description below are merely some embodiments of the present disclosure. For those of ordinary skill in the art, other accompanying drawings may be obtained based on these accompanying drawings without any creative efforts.

DETAILED DESCRIPTION

Figure 1:
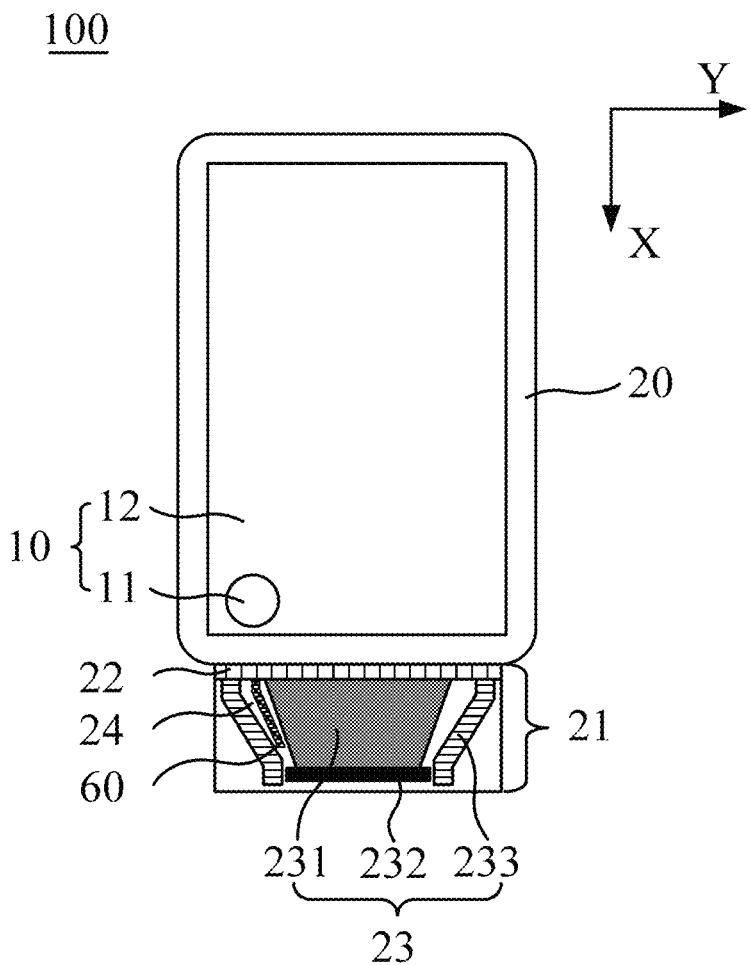
FIG. 1 is a structural schematic view of an under-screen camera display screen before bending in some embodiments of the present disclosure.

The technical solutions in the embodiments of the present disclosure may be explained in detail by combining the accompanying drawings.

In the following description, specific details such as specific system structures, interfaces, technologies, etc. are proposed for the purpose of illustration rather than limitation, so as to fully understand the present disclosure.

The technical solutions in some embodiments of the present disclosure may be clearly and completely described in conjunction with accompanying drawings in some embodiments of the present disclosure. Obviously, the described embodiments are only a part of the embodiments of the present disclosure, and not all embodiments. Based on the embodiments in the present disclosure, all other embodiments obtained by those of ordinary skill in the art without creative effort are within the scope of the present disclosure.

The terms "first", "second", and "third" in the present disclosure are only configured to describe purposes and cannot be understood as indicating or implying relative importance or implicit indicating the quantity of technical features indicated. Therefore, features limited to "first", "second", and "third" may explicitly or implicitly include at least one of these features. In the description of the present disclosure, "multiple" means at least two, such as two, three, etc., unless otherwise expressly and specifically qualified. All directional indications (such as up, down, left, right, front, rear, or the like) in some embodiments of the present disclosure are only configured to explain a relative position relationship between components in a specific posture (as shown in the accompanying drawings), a motion situation between the components in the specific posture (as shown in the accompanying drawings), or the like. If the specific posture is changed, the directional indication is also changed accordingly. In addition, the terms "including", "comprising", and "having", as well as any variations of the terms "including", "comprising", and "having", are intended to cover non-exclusive inclusions. For example, a process, method, system, product, or device that includes a series of operations or units is not limited to the listed operations or units, but optionally includes operations or units that are not listed, or optionally includes other operations or units that are inherent to these processes, methods, products, or devices. The reference to "embodiment" in the present disclosure means that, specific features, structures, or characteristics described in conjunction with some embodiments may be included in at least one embodiment of the present disclosure. The phrase appearing in various positions in the specification does not necessarily refer to the same embodiment, nor is it an independent or alternative embodiment that is mutually exclusive with other embodiments. Those of ordinary skill in the art explicitly and implicitly understand that the embodiments described in the present disclosure may be combined with other embodiments.

A main technical problem solved by the present disclosure is that a front-facing camera is difficult to have a high screen to body ratio. Thus, the present disclosure provides an under-screen camera display screen and a display device, which may solve the problem that the front-facing camera is difficult to have the high screen to body ratio.

Figure 2:
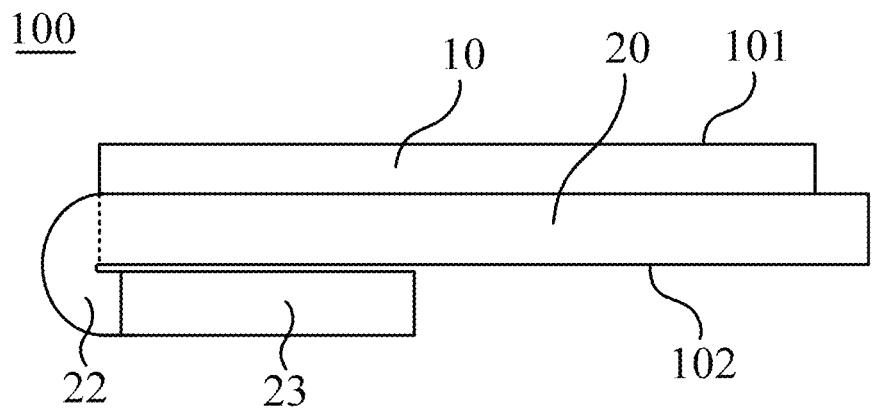
FIG. 2 is a structural schematic view of the under-screen camera display screen after bending in some embodiments of the present disclosure.

As illustrated in FIG. 1 and FIG. 2, FIG. 1 is a structural schematic view of an under-screen camera display screen before bending in some embodiments of the present disclosure, and FIG. 2 is a structural schematic view of the under-screen camera display screen after bending in some embodiments of the present disclosure.

Figure 6:
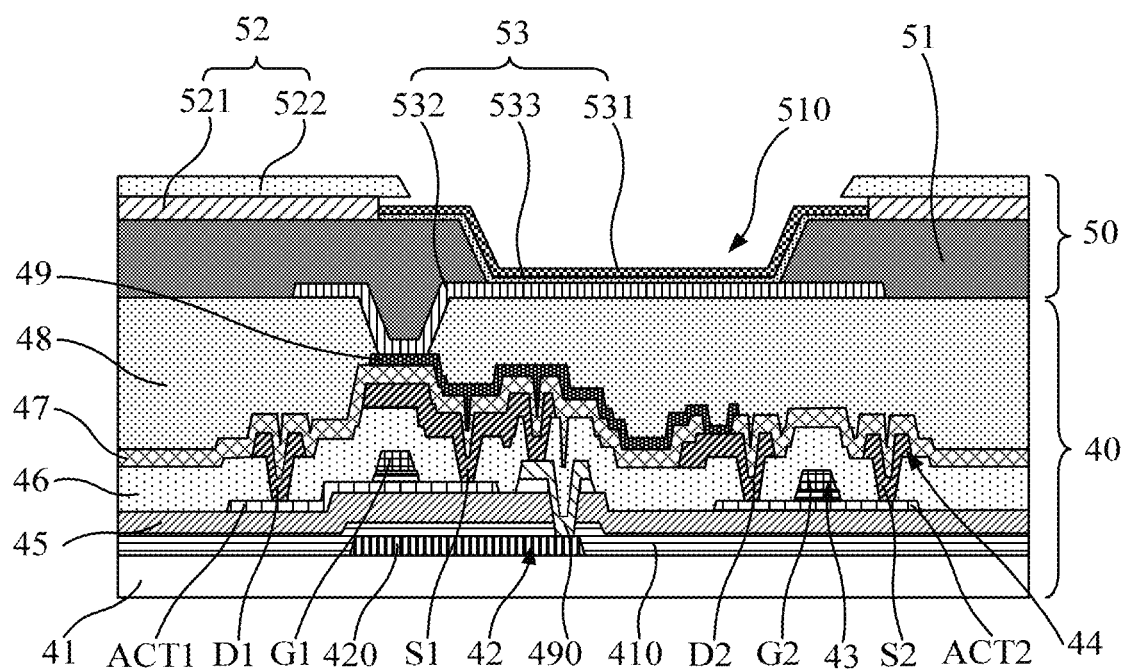
FIG. 6 is a longitudinal cross-sectional structural schematic view of an array substrate and a pixel device layer in some embodiments of the present disclosure.

The present disclosure provides an under-screen camera display screen 100. The under-screen camera display screen 100 includes a display area 10 and a non-display area 20. The display area 10 includes an under-screen camera area 11. The non-display area 20 that is located on a side of the display area 10 and close to the under-screen camera area 11 includes a bending area 22 and a wiring area 23, and the wiring area 23 is located on a side of the bending area 22 away from the display area 10. After bending the bending area 22, the wiring area 23 and at least a part of the bending area 22 are attached to a non-display side 102 of the under-screen camera display screen 100. The under-screen camera display screen 100 includes a pixel circuit (not shown in the figures), and the pixel circuit includes a first pixel circuit 60. The first pixel circuit 60 is configured to drive a light-emitting device 53 (as shown in FIG. 6) corresponding to the under-screen camera area 11 to emit light. The first pixel circuit 60 is disposed in the wiring area 23. In the present disclosure, the first pixel circuit 60 that drives the light-emitting device 53 corresponding to the under-screen camera area 11 to emit light is disposed in the wiring area 23 of the non-display area 20. That is, the remaining space in the wiring area 23 is configured to accommodate the first pixel circuit 60, thereby avoiding the first pixel circuit 60 from occupying the area of the under-screen camera area 11. Thus, the light transmittance of the under-screen camera area 11 is improved, thereby enabling the under-screen camera area 11 to have dual functions of light-transmission and display, and increasing the screen to body ratio of the under-screen camera display screen 100.

Figure 4:
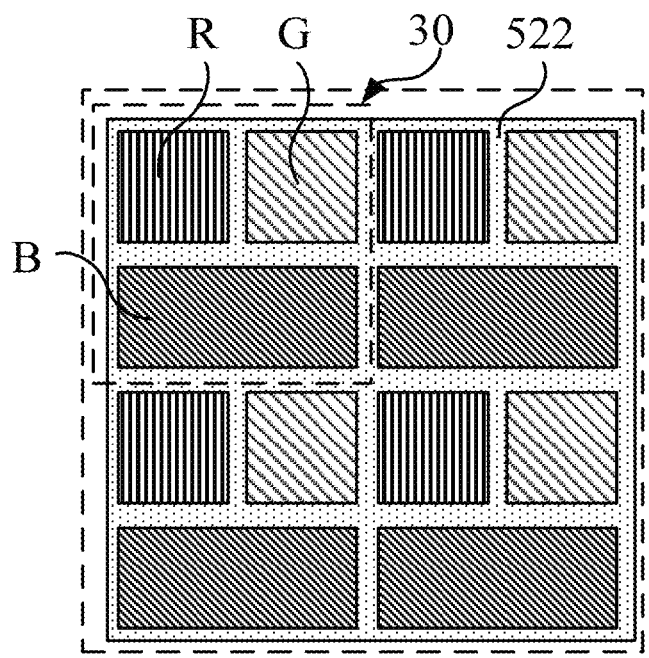
FIG. 4 is an enlarged structural schematic view of H part in FIG. 3.

The non-display area 20 surrounds the display area 10. That is, the non-display area 20 is disposed around the display area 10. The pixel units 30 (as shown in FIG. 4) are disposed in the display area 10, and the pixel units 30 are arranged in a matrix and configured for displaying images. Other modules configured for controlling the display of images, such as control circuits (not shown in the figures), or control wirings (not shown in the figures), are disposed in the non-display area 20.

The non-display area 20 that is located on the side of the display area 10 and close to the under-screen camera area 11 is defined as a folding area 21. The folding area 21 is bound with a driver chip (not shown in the figures) or a flexible circuit board (not shown in the figures) that is configured to drive the pixel unit 30 of the display area 10 to display.

The folding area 21 includes the bending area 22 and the wiring area 23, and the wiring area 23 is located on the side of the bending area 22 away from the display area 10. After bending the bending area 22, at least a part of the folding area 21 is attached to the non-display side 102 of the under-screen camera display screen 100, so as to reduce an area occupied by the non-display area 20 of a display side 101. The display side 101 is opposite to the non-display side 102 in the under-screen camera display screen 100. A width of a border is further reduced, thereby achieving narrow border. A proportion of an area of the display area 10 of the display side 101 to an area of the under-screen camera display screen 100 is increased, which is beneficial to improve the screen to body ratio of the under-screen camera display screen 100.

In some embodiments, the wiring area 23 includes a fanout area 231, a binding area 232, and a winding area 233. The bending area 22, fanout area 231, and binding area 232 are arranged in a first direction X, and the first direction X is from the display area 10 to the bending area 22. That is, the fanout area 231 is disposed between the bending area 22 and the binding area 232, the binding area 232 is disposed away from the display area 10, and the fanout area 231 is disposed close to the display area 10. The winding area 233 and fanout area 231 are arranged along a second direction Y, and the first direction X intersects the second direction Y. That is, each side of the fanout area 231 along the second direction Y is provided with the winding area 233. The first pixel circuit 60 is located in a blank area 24 between the fanout area 231 and the winding area 233.

The binding area 232 is configured to bind the driver chip or the flexible circuit board, so as to obtain signals output by the driver chip or the flexible circuit board. Multiple fanout lines (not shown in the figures) are disposed in the fanout area 231, and the fanout lines are configured to input the signals that are output by the driver chip or the flexible circuit board to each pixel unit 30 in the display area 10. The winding area 233 is provided with power lines (not shown in the figures) and multiple signal lines (not shown in the figures), and the signal lines are configured for scanning and driving. The winding area 233 is configured to input the signal that are output by the driver chip or the flexible circuit board to the control circuit of the non-display area 20. The power lines may be power signal lines, such as low potential signal lines VSS, high potential signal lines VDD, or the like.

The bending area 22 is disposed close to the display area 10, and configured to transmit the signal output from the fanout area 231 to each pixel unit 30 and transmit the signal output from the winding area 233 to the control circuit of the non-display area 20. Furthermore, the fanout area 231, the winding area 233, and the binding area 232 of the non-display area 20 may be bend to the back of the under-screen camera display screen 100. That is, the fanout area 231, the winding area 233, and the binding area 232 of the non-display area 20 may be bend to the non-display side 102 of the under-screen camera display screen 100. As illustrated in FIG. 2, the wiring area 23 and a part of the bending area 22 are bent to the non-display side 102 and attached to the non-display side 102 of the under-screen camera display screen 100, causing the non-display area 20 of the display side 101 of the under-screen camera display screen 100 to narrow. Thus, the proportion of the area of the display area 10 to the area of the under-screen camera display screen 100 increases, which is beneficial to improve the screen to body ratio of the under-screen camera display screen 100.

In related art, dummy wiring (not shown in the figures) is generally filled in the blank area 24 between the fanout area 231 and the winding area 233. In the present disclosure, normal layouts of the fanout area 231, the winding area 233, and the binding area 232 are retained, the dummy wiring filled in the blank area 24 between fanout area 231 and winding area 233 are removed, and the first pixel circuit 60 is disposed in the blank area 24 between fanout area 231 and winding area 233. On the premise of not affecting the normal display of the under-screen camera display screen 100, the first pixel circuit 60 avoids occupying the area of the under-screen camera area 11, thereby improving the light transmittance of the under-screen camera area 11 and increasing the screen to body ratio of the under-screen camera display screen 100.

The display area 10 further includes multiple data lines (not shown in the figures), and the data lines extend along the first direction X and are arranged along the second direction Y. That is, the folding area 21 is located on a side of the display area 10 along extending directions of the data lines, so as to facilitate the connection between the bending area 22 and the pixel units 30 in the display area 10, thereby reducing wiring and facilitating the realization of narrow borders.

In some embodiments, the first direction X is perpendicular to the second direction Y. In some embodiments, the first direction X is not perpendicular to the second direction Y, as long as the fanout area 231 and the winding area 233 are not arranged along the first direction X, and the winding area 233 is disposed close to the bending area 22. Thus, on the premise of not affecting the normal use of the folding area 21, the connection wirings between the first pixel circuit 60 located in the blank area 24 and the light-emitting device 53 corresponding to the under-screen imaging area 11 may be minimized as much as possible.

The under-screen camera area 11 is located in a junction area between both adjacent sides of the display area 10, and close to the blank area 24. As illustrated in FIG. 1, the folding area 21 is disposed below the display area 10, the under-screen camera area 11 is disposed on a bottom left corner or a bottom right corner of the display area 10, and disposed close to the blank area 24. Thus, an end of the first pixel circuit 60 located in the blank area 24 is configured to connected to an anode of the light-emitting device 53, and the end of the first pixel circuit 60 is connected to the light-emitting device 53 corresponding to the under-screen camera area 11 through a lead wire.

A position of the under-screen camera area 11 is related to a position of the folding area 21 and a position of the blank area 24 in the folding area 21. The under-screen camera area 11 is located on the side of the display area 10 close to the folding area 21, and disposed close to the blank area 24. A shape and a size of the under-screen camera area 11 are not limited, and may be selected according to actual needs.

A perspective of the under-screen camera display screen 100 in FIG. 1 of the present disclosure is not the perspective of the under-screen camera display screen 100 during normal use.

The pixel circuit further includes a second pixel circuit (not shown in the figures), and the display area 10 further includes a non-under-screen camera area 12. The second pixel circuit is configured to drive the light-emitting device 53 corresponding to the non-under-screen camera area 12 to emit light. The second pixel circuit corresponds to the non-under-screen camera area 12, that is, the second pixel circuit is located below the non-under-screen camera area 12.

A structure of the first pixel circuit 60 may be the same as or different from a structure of the second pixel circuit. The structure of the first pixel circuit 60 and the structure of the second pixel circuit are not limited, and may be selected according to actual needs.

The non-under-screen camera area 12 is a normal display area of the under-screen camera display screen 100. The use of a front-facing camera function does not affect the display of the images in the non-under-screen camera area 12. The under-screen camera area 11 does not display the images when using the front-facing camera function.

Figure 3:
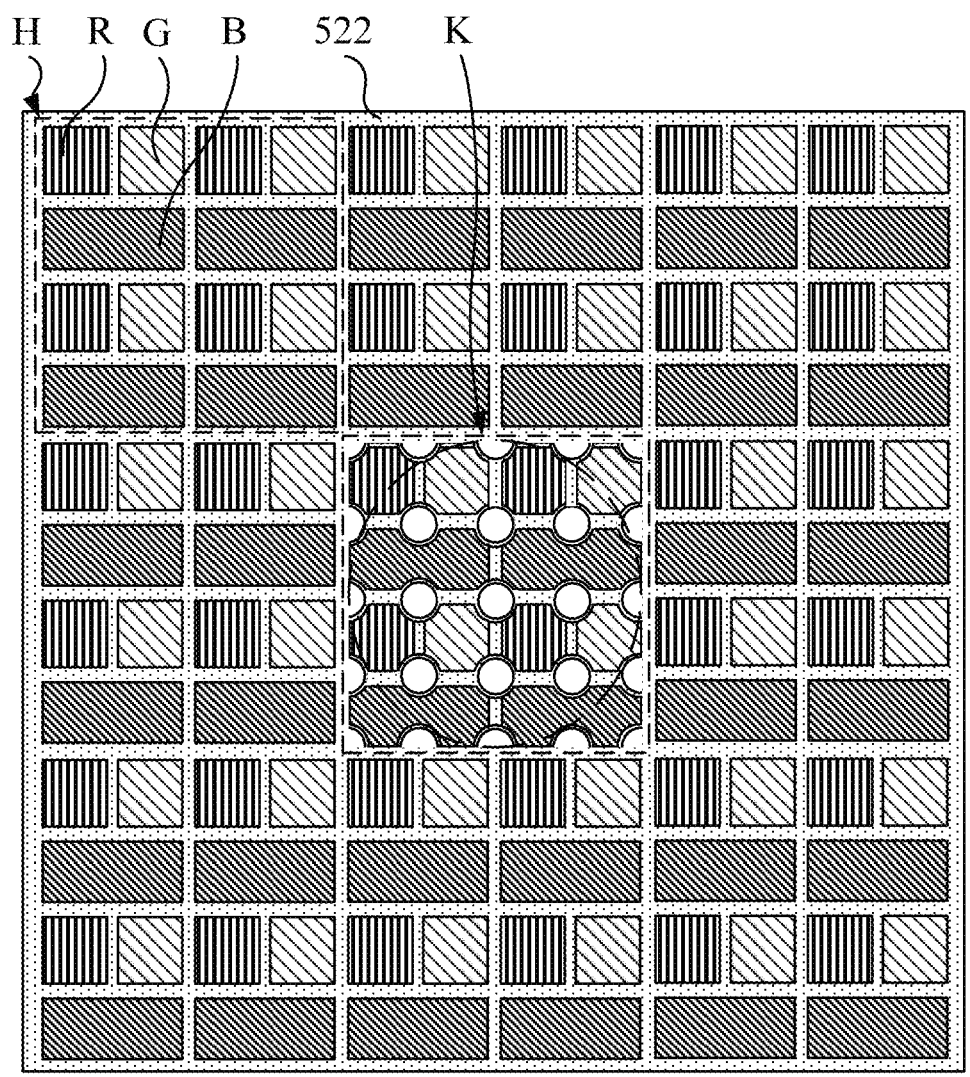
FIG. 3 is a partial structural schematic view of pixel arrangement in some embodiments of the present disclosure.
Figure 5:
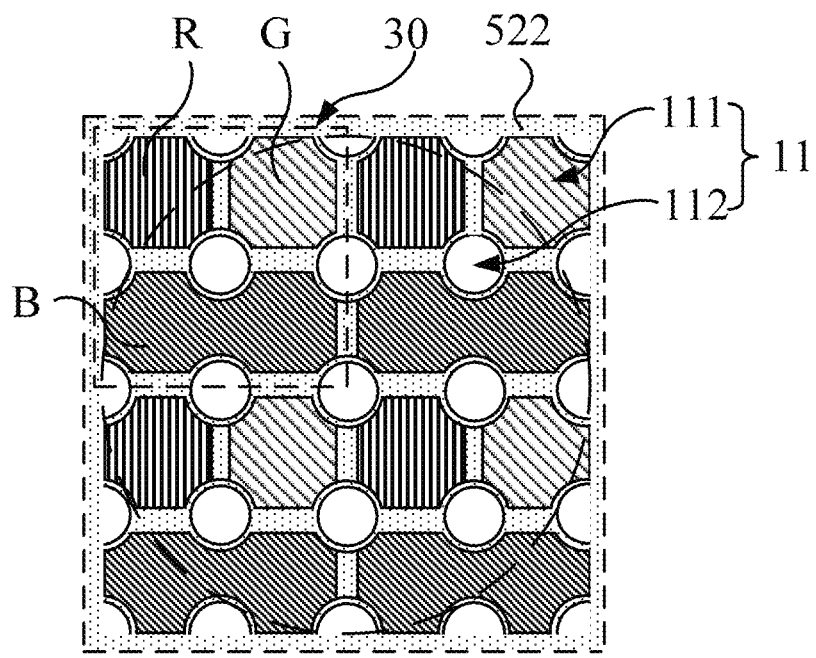
FIG. 5 is an enlarged structural schematic view of K part in FIG. 3.

As illustrated in FIG. 1 to FIG. 5, FIG. 3 is a partial structural schematic view of pixel arrangement in some embodiments of the present disclosure, FIG. 4 is an enlarged structural schematic view of H part in FIG. 3, and FIG. 5 is an enlarged structural schematic view of K part in FIG. 3.

The under-screen camera area 11 includes multiple under-screen pixel areas 111 and multiple light-transmitting areas 112, and each light-transmitting area 112 is disposed between the under-screen pixel areas 111. The under-screen pixel area 111 corresponds to the light-emitting device 53. The under-screen pixel area 111 is configured to accommodate pixels, so as to display the images when not using the front-facing camera function. The light-transmission area 112 is configured to transmit external light when using the front-facing camera function. Thus, the under-screen camera area 11 has dual functions of light-transmission and display, thereby achieving normal display of the under-screen camera area 11 and improving the screen to body ratio of the under-screen camera display screen 100.

Taking a pixel layout of the display area 10 as an example, the pixel layouts of the under-screen camera area 11 and the non-under-screen camera area 12 may be explained below.

Figure 8:
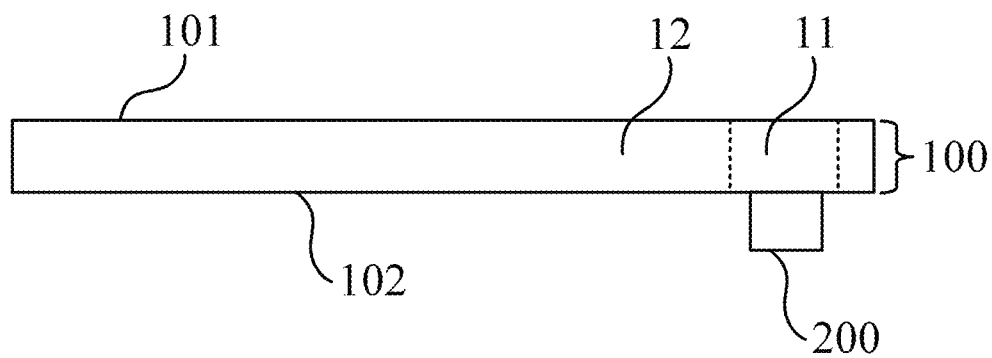
FIG. 8 is a structural schematic view of a display device in some embodiments of the present disclosure.

The non-under-screen camera area 12 includes three pixels with different colors, namely red pixel R, blue pixel B, and green pixel G. One red pixel R, one blue pixel B, and one green pixel G forms one pixel unit 30. The pixel units 30 are arranged in an array. In each pixel unit 30, the red pixel R and green pixel G are disposed side by side on the same side of the blue pixel B. An insulation barrier layer 522 is disposed between pixels. The pixel layout of the under-screen camera area 11 is the same as that of the non-under-screen camera area 12. Based on this, as illustrated in FIG. 5, the under-screen camera area 11 further includes the light-transmitting area 112 that is located between the under-screen pixel areas 111. The light-transmitting area 112 may sacrifice some pixel space, thereby reducing a light-emitting area of each pixel of the pixel unit 30. A pixel density of the under-screen camera area 11 is less than that of the non-under-screen camera area 12. A distribution, a shape, and a size of the light-transmitting area 112 not limited, and may be selected according to actual needs. A circular dashed line in FIG. 5 represents a position of a camera module 200 (as shown in FIG. 8). The under-screen camera display screen 100 does not include the camera module 200.

A pixel layout structure of the display area 10 in the present disclosure includes but is not limited to above pixel layout. The under-screen camera display screen 100 of the present disclosure is suitable for various pixel layout structures in related art.

Figure 7:
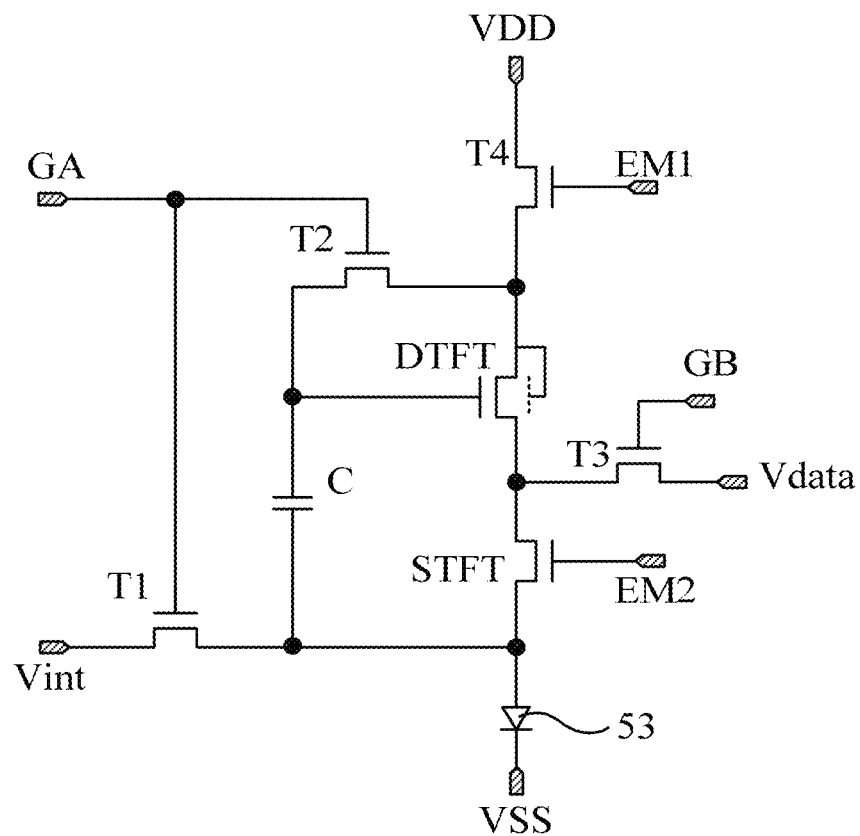
FIG. 7 is a structural schematic view of a first pixel circuit in some embodiments of the present disclosure.

As illustrated in FIG. 2, FIG. 6, and FIG. 7, FIG. 6 is a longitudinal cross-sectional structural schematic view of an array substrate and a pixel device layer in some embodiments of the present disclosure, and FIG. 7 is a structural schematic view of a first pixel circuit in some embodiments of the present disclosure.

As illustrated in FIG. 6, the under-screen camera display screen 100 includes a driving substrate 40. The driving substrate 40 includes a base 41, a first metal layer 42, a second metal layer 43, and a third metal layer 44. The first metal layer 42, the second metal layer 43, and the third metal layer 44 are sequentially formed on a side of the base 41.

The first metal layer 42 is configured to form a light-shielding metal layer 420.

The second metal layer 43 is configured to form a first gate electrode G1 and a second gate electrode G2 that are insulated from each other.

The third metal layer 44 is configured to form a first source electrode S1, a second source electrode S2, a first drain electrode D1, and a second drain electrode D2 that are insulated from each other.

The first gate electrode G1, the first drain electrode D1, and the first source electrode S1 are configured to form a driving transistor DTFT of the first pixel circuit 60. The driving transistor DTFT is configured to control current of the light-emitting device 53. The second gate electrode G2, the second source electrode S2, and the second drain electrode D2 are configured to form a switching transistor STFT of the first pixel circuit 60. In the first pixel circuit 60, the switching transistor STFT is connected between the light-emitting device 53 and the driving transistor DTFT. An anode 532 of the light-emitting device 53 is connected to the second drain electrode D2 of the switching transistor STFT through a via lead layer 49. The via lead layer 49 at least partially overlaps with the first source electrode S1 of the driving transistor DTFT in a direction perpendicular to the base 41, so as to form a storage capacitor C.

The driving transistor DTFT is a top gate structure, and the driving transistor DTFT further includes an active layer ACT1. The light-shielding metal layer 420 is disposed on a bottom of the driver transistor DTFT. When using the front-facing camera function, the light-shielding metal layer 420 may shield or block scattered light from the camera, thereby protecting the performance of the driver transistor DTFT from being affected by light.

In some embodiments, the switching transistor STFT is also the top gate structure, and the switching transistor STFT further includes an active layer ACT2. The light-shielding metal layer 420 is connected to the first gate electrode G1 of the driving transistor DTFT and the first source electrode S1 of the driving transistor DTFT, respectively, to form a double gate transistor. In some embodiments, the light-shielding metal layer 420 is connected to the first source electrode S1 of the driving transistor DTFT through a via lead 490. The first gate electrode G1, the first drain electrode D1, the first source electrode S1, and the light-shielding metal layer 420 form the double gate transistor. That is, the driving transistor DTFT in the first pixel circuit 60 is the double gate transistor, and the light-shielding metal layer 420 is used as a bottom gate electrode. That is, a selfgenerated bottom gate electrode is used in an edge area of the camera to shield or block the scattered light of the camera, so as to protect the performance of the driving transistor DTFT from being affected by the light. The disposing of the light-shielding metal layer 420 may not only provide a light-shielding and protecting function, but also form the double gate transistor, thereby improving using performance of the driving transistor DTFT and enhancing the light-emitting performance of the light-emitting device 53.

In some embodiments, the light-shielding metal layer 420 may be independently disposed without conducting with the first source electrode S1 and the first gate electrode G1, and the light-shielding metal layer 420 only serves as the light-shielding and protecting function. The driving substrate 40 further includes an insulation layer 410, a buffer layer 45, an interlayer dielectric layer 46, a passivation layer 47, and a planarization layer 48. The insulation layer 410, the buffer layer 45, the interlayer dielectric layer 46, the passivation layer 47, and the planarization layer 48 are sequentially formed on the side of the base 41. The insulation layer 410 covers the first metal layer 42, the buffer layer 45 is disposed between the insulation layer 410 and the second metal layer 43, and the interlayer dielectric layer 46 is disposed between the second metal layer 43 and the third metal layer 44. The insulation layer 410 and the buffer layer 45 may be made of the same material and prepared in one process. Alternatively, the insulation layer 410 and the buffer layer 45 may be made of different materials. The materials of the insulation layer 410 and the buffer layer 45 are not limited, and may be selected according to actual needs. The passivation layer 47 and the planarization layer 48 are sequentially stacked on the side of the third metal layer 44 away from the base 41. The through-hole lead layer 49 is disposed between the passivation layer 47 and the planarization layer 48. The anode 532 of the light-emitting device 53 passes through the planarization layer 48 and is connected to the via hole lead layer 49. The materials of the insulation layer 410, the buffer layer 45, the interlayer dielectric layer 46, the passivation layer 47, and the planarization layer 48 are not limited, and may be selected according to actual needs.

The under-screen camera display screen 100 further includes a light-emitting device layer 50, and the light-emitting device layer 50 is located on a side of the driving substrate 40 away from the base 41. The light-emitting device layer 50 includes a pixel definition layer 51, a spacer 52, and a light-emitting device 53. The pixel definition layer 51 defines an opening 510, and the light-emitting device 53 is located in the opening 510. The spacer 52 is disposed on a side of the pixel definition layer 51 away from the base 41 and avoids the opening 510. That is, the spacer 52 is spaced apart from the opening 510. The spacer 52 includes a conductive layer 521 and an insulation barrier layer 522, and the insulation barrier layer 522 is located on a side of the conductive layer 521 away from the base 41. A cathode 531 of the light-emitting device 53 is connected to the conductive layer 521. The light-emitting device 53 further includes a light-emitting layer 533 located between the cathode 531 and the anode 532. The pixels are disposed between the insulation barrier layers 522, and the pixels are facing the opening 510.

In the present disclosure, the spacer 52 is disposed, which is different from a full surface evaporation process of a fine metal mask (FMM). In the process of preparing the cathode 531, there is no need to a laser process to pattern the cathode 531, which may simplify the process.

The light-emitting device 53 is an organic light-emitting diode (OLED).

The first pixel circuit 60 is taken as an example for explanation.

As illustrated in FIG. 7, the first pixel circuit 60 not only includes the driving transistor DTFT and the switching transistor STFT, but also includes a first transistor T1, a second transistor T2, a third transistor T3, a fourth transistor T4, and a capacitor C. A control terminal of the first transistor T1 and a control terminal of the second transistor T2 are connected to a first control signal GA. The first transistor T1 is configured to be connected to an initial signal Vint, so as to reset the first pixel circuit 60. The third transistor T3 is configured to respond to the second control signal GB and be connected to a data voltage, so as to charge capacitor C. The fourth transistor T4 is configured to respond to a first light-emitting control signal EM1 and be connected to the power supply voltage VDD. A control terminal (i.e., the second gate electrode G2) of the switching transistor STFT is connected to a second light-emitting control signal EM2. The cathode 531 of the light-emitting device 53 is connected to the low potential signal line VSS. A specific circuit connection relationship of the first pixel circuit 60 is illustrated in FG. 7, which is not described in detail here.

The first pixel circuit 60 of the present disclosure includes but is not limited to above structure.

In some embodiments, in the first pixel circuit 60, the driving transistor DTFT is a four-terminal device, all other transistors are three-terminal devices. The four-terminal device refers to the double gate transistor. The transistors are oxide thin film transistors. A turn-on speed of the driving transistor DTFT in some embodiments is relatively slow, and a subthreshold swing (SS) is larger, which is beneficial for grayscale expansion. The other transistors have faster turn-on speeds and larger switching ratios, thus, other transistors are suitable to use as switching devices.

In some embodiments, at least one of the remaining transistors is the four-terminal device.

The present disclosure provides the under-screen camera display screen 100. The under-screen camera display screen 100 includes the display area 10 and the non-display area 20. The display area 10 includes the under-screen camera area 11. The non-display area 20 that is located on the side of the display area 10 and close to the under-screen camera area 11 includes the bending area 22 and the wiring area 23, and the wiring area 23 is located on the side of the bending area 22 away from the display area 10. After bending the bending area 22, the wiring area 23 and at least a part of the bending area 22 are attached to the non-display side 102 of the under-screen camera display screen 100. The under-screen camera display screen 100 includes the pixel circuit, and the pixel circuit includes the first pixel circuit 60. The first pixel circuit 60 is configured to drive the light-emitting device 53 corresponding to the under-screen camera area 11 to emit light. The first pixel circuit 60 is disposed in the wiring area 23. In the present disclosure, the first pixel circuit 60 that drives the light-emitting device 53 corresponding to the under-screen camera area 11 to emit light is disposed in the wiring area 23 of the non-display area 20. That is, the remaining space in the wiring area 23 is configured to accommodate the first pixel circuit 60, thereby avoiding the first pixel circuit 60 from occupying the area of the under-screen camera area 11. Thus, the light transmittance of the under-screen camera area 11 is improved, thereby enabling the under-screen camera area 11 to have dual functions of light-transmission and display, and increasing the screen to body ratio of the under-screen camera display screen 100.

As illustrated in FIG. 8, FIG. 8 is a structural schematic view of a display device in some embodiments of the present disclosure.

The present disclosure provides a display device, and the display device includes the camera module 200 and the under-screen camera display screen 100 as described above.

The under-screen camera display screen 100 includes the display side 101 and the non-display side 102, and the display side 101 is opposite to the non-display side 102. The camera module 200 is disposed on the non-display side 102 of the under-screen camera display screen 100, and corresponds to the under-screen camera area 11.

The camera module 200 includes a camera. The camera is a front-facing camera. When using the camera, the under-screen camera area 11 does not display, thereby allowing the camera to take pictures. When the camera is not used, the under-screen camera area 11 may display. Thus, on the premise of retaining the camera function, the screen to body ratio may be increased.

Different from the related art, the effects of the present disclosure are as follows. The present disclosure provides the under-screen camera display screen and the display device. The under-screen camera display screen includes the display area and the non-display area. The display area includes the under-screen camera area. The non-display area that is located on the side of the display area and close to the under-screen camera area includes the bending area and the wiring area, the wiring area is located on the side of the bending area away from the display area. After bending the bending area, the wiring area and at least a part of the bending area are attached to the non-display side of the under-screen camera display screen. The under-screen camera display screen includes the pixel circuit. The pixel circuit includes the first pixel circuit that is configured to drive the light-emitting device corresponding to the under-screen camera area to emit light. The first pixel circuit is disposed in the wiring area. In the present disclosure, the first pixel circuit that drives the light-emitting device corresponding to the under-screen camera area to emit light is disposed in the wiring area of the non-display area. That is, the remaining space in the wiring area is configured to accommodate the first pixel circuit, thereby avoiding the first pixel circuit from occupying the area of the under-screen camera area. Thus, the light transmittance of the under-screen camera area is improved, thereby enabling the under-screen camera area to have dual functions of light-transmission and display, and increasing the screen to body ratio of the under-screen camera display screen.

The above descriptions are only some embodiments of the present disclosure, and are not intended to limit the scope of the present disclosure. Any equivalent structure or equivalent flow transformation made by using the contents of the specification and accompanying drawings of the present disclosure, or directly or indirectly applied to other related technical fields, is included in the scope of the patent protection of the present disclosure.

What is claimed is:

1. An under-screen camera display screen, comprising:
   a display area, comprising an under-screen camera area; and
   a non-display area, wherein the non-display area that is located on a side of the display area and close to the under-screen camera area comprises a bending area and a wiring area, the wiring area is located on a side of the bending area away from the display area; the wiring area and at least a part of the bending area are attached to a non-display side of the under-screen camera display screen;
   wherein the under-screen camera display screen comprises:
   a pixel circuit, comprising a first pixel circuit that is configured to drive a light-emitting device corresponding to the under-screen camera area to emit light, wherein the first pixel circuit is disposed in the wiring area;
   the wiring area comprises:
      a fanout area:
      a binding area; and
      a winding area;
      wherein the bending area, the fanout area, and the binding area are arranged in a first direction, and the first direction is from the display area to the bending area; the winding area and the fanout area are arranged along a second direction, and the first direction intersects with the second direction; and the first pixel circuit is located in a blank area between the fanout area and the winding area, and the blank area is free of dummy wiring.

2. The under-screen camera display screen according to claim 1, wherein the display area further comprises a plurality of data lines, and the plurality of data lines extend along the first direction and are arranged along the second direction; and the under-screen camera area is located in a junction area between both adjacent sides of the display area, and close to the blank area.

3. The under-screen camera display screen according to claim 1, wherein the pixel circuit further comprises a second pixel circuit, the display area further comprises a non-under-screen camera area, the second pixel circuit is configured to drive the light-emitting device corresponding to the non-under-screen camera area to emit light.

4. The under-screen camera display screen according to claim 1, wherein the under-screen camera area comprises a plurality of under-screen pixel areas and a plurality of light-transmitting areas, each of the plurality of light-transmitting areas is between the plurality of under-screen pixel areas, and each of the plurality of under-screen pixel areas corresponds to one light-emitting device.

5. The under-screen camera display screen according to claim 1, wherein the under-screen camera display screen comprises a driving substrate; the driving substrate comprises a base, a first metal layer, a second metal layer, and a third metal layer; the first metal layer, the second metal layer, and the third metal layer are sequentially formed on a side of the base;
   the first metal layer is configured to form a light-shielding metal layer;
   the second metal layer is configured to form a first gate electrode and a second gate electrode that are insulated from each other;
   the third metal layer is configured to form a first source electrode, a second source electrode, a first drain electrode, and a second drain electrode that are insulated from each other;
   the first gate electrode, the first drain electrode, and the first source electrode are configured to form a driving transistor of the first pixel circuit, and the driving transistor is configured to control current of the light-emitting device; the second gate electrode, the second source electrode, and the second drain electrode are configured to form a switching transistor of the first pixel circuit; in the first pixel circuit, the switching transistor is connected between the light-emitting device and the driving transistor; and an anode of the light-emitting device is connected to the second drain electrode of the switching transistor through a via lead layer, and the via lead layer at least partially overlaps with the first source electrode of the driving transistor in a direction perpendicular to the base, so as to form a storage capacitor.

6. The under-screen camera display screen according to claim 5, wherein the driving transistor is a top gate structure, and the light-shielding metal layer is connected to the first gate electrode of the driving transistor and the first source electrode of the driving transistor, respectively, so as to form a double gate transistor.

7. The under-screen camera display screen according to claim 6, further comprising a light- emitting device layer, wherein the light-emitting device layer is disposed on a side of the driving substrate away from the base, and the light-emitting device layer comprises:

a pixel definition layer, defining an opening;

the light-emitting device, disposed in the opening; and a spacer, disposed on a side of the pixel definition layer away from the base and avoiding the opening; wherein the spacer comprises a conductive layer and an insulation barrier layer disposed on a side of the conductive layer away from the base, and a cathode of the light-emitting device is connected to the conductive layer.

8. The under-screen camera display screen according to claim 1, wherein the light-emitting device is an organic light-emitting diode.

9. The under-screen camera display screen according to claim 1, wherein the first direction is perpendicular to the second direction.

10. A display device, comprising:

a camera module; and an under-screen camera display screen, comprising:

a display area, comprising an under-screen camera area; and a non-display area, wherein the non-display area that is located on a side of the display area and close to the under-screen camera area comprises a bending area and a wiring area, the wiring area is located on a side of the bending area away from the display area; the wiring area and at least a part of the bending area are attached to a non-display side of the under-screen camera display screen;

wherein the under-screen camera display screen comprises:

a pixel circuit, comprising a first pixel circuit that is configured to drive a light-emitting device corresponding to the under-screen camera area to emit light, wherein the first pixel circuit is disposed in the wiring area;

the wiring area comprises:

a fanout area;

a binding area; and a winding area;

wherein the bending area, the fanout area, and the binding area are arranged in a first direction, and the first direction is from the display area to the bending area; the winding area and the fanout area are arranged along a second direction, and the first direction intersects with the second direction; and the first pixel circuit is located in a blank area between the fanout area and the winding area, and the blank area is free of dummy wiring;

wherein the under-screen camera display screen comprises a display side and a non-display side that are opposite to each other, and the camera module is disposed on the non-display side of the under-screen camera display screen and corresponds to the under-screen camera area.

11. The display device according to claim 10, wherein the display area further comprises a plurality of data lines, and the plurality of data lines extend along the first direction and are arranged along the second direction; and the under-screen camera area is located in a junction area between both adjacent sides of the display area, and close to the blank area.

12. The display device according to claim 10, wherein the pixel circuit further comprises a second pixel circuit, the display area further comprises a non-under-screen camera area, the second pixel circuit is configured to drive the light-emitting device corresponding to the non-under-screen camera area to emit light.

13. The display device according to claim 10, wherein the under-screen camera area comprises a plurality of under-screen pixel areas and a plurality of light-transmitting areas, each of the plurality of light-transmitting areas is between the plurality of under-screen pixel areas, and each of the plurality of under-screen pixel areas corresponds to one light-emitting device.

14. The display device according to claim 10, wherein the under-screen camera display screen comprises a driving substrate; the driving substrate comprises a base, a first metal layer, a second metal layer, and a third metal layer; the first metal layer, the second metal layer, and the third metal layer are sequentially formed on a side of the base;

the first metal layer is configured to form a light-shielding metal layer;

the second metal layer is configured to form a first gate electrode and a second gate electrode that are insulated from each other;

the third metal layer is configured to form a first source electrode, a second source electrode, a first drain electrode, and a second drain electrode that are insulated from each other;

the first gate electrode, the first drain electrode, and the first source electrode are configured to form a driving transistor of the first pixel circuit, and the driving transistor is configured to control current of the light-emitting device; the second gate electrode, the second source electrode, and the second drain electrode are configured to form a switching transistor of the first pixel circuit; in the first pixel circuit, the switching transistor is connected between the light-emitting device and the driving transistor; and an anode of the light-emitting device is connected to the second drain electrode of the switching transistor through a via lead layer, and the via lead layer at least partially overlaps with the first source electrode of the driving transistor in a direction perpendicular to the base, so as to form a storage capacitor.

15. The display device according to claim 14, wherein the driving transistor is a top gate structure, and the light-shielding metal layer is connected to the first gate electrode of the driving transistor and the first source electrode of the driving transistor, respectively, so as to form a double gate transistor.

16. The display device according to claim 15, further comprising a light-emitting device layer, wherein the light-emitting device layer is disposed on a side of the driving substrate away from the base, and the light-emitting device layer comprises:
- a pixel definition layer, defining an opening;
- the light-emitting device, disposed in the opening; and
- a spacer, disposed on a side of the pixel definition layer away from the base and avoiding the opening; wherein the spacer comprises a conductive layer and an insulation barrier layer disposed on a side of the conductive layer away from the base, and a cathode of the light-emitting device is connected to the conductive layer.

17. The display device according to claim 10, wherein the light-emitting device is an organic light-emitting diode.

18. The display device according to claim 10, wherein the first direction is perpendicular to the second direction.

19. The display device according to claim 10, wherein the non-display area that is located on the side of the display area and close to the under-screen camera area is defined as a folding area, the binding area is configured to bind a driver chip or a circuit board, so that the first pixel circuit and the driver chip or the circuit board are both located in the same folding area.

20. The display device according to claim 1, wherein the non-display area that is located on the side of the display area and close to the under-screen camera area is defined as a folding area, the binding area is configured to bind a driver chip or a circuit board, so that the first pixel circuit and the driver chip or the circuit board are both located in the same folding area.

* * * * *